(12) United States Patent
Chu

(10) Patent No.: US 7,246,654 B2
(45) Date of Patent: Jul. 24, 2007

(54) HEAT DISSIPATING DEVICE

(76) Inventor: Yun-Chieh Chu, 11F, No. 44, Maijin Rd., Anle Dist., Keelung (TW)

( * ) Notice: Subject to any disclaimer, the term of this patent is extended or adjusted under 35 U.S.C. 154(b) by 273 days.

(21) Appl. No.: 11/025,956

(22) Filed: Jan. 3, 2005

(65) Prior Publication Data

US 2006/0144559 A1   Jul. 6, 2006

(51) Int. Cl.
*H05K 7/20* (2006.01)
(52) U.S. Cl. .................... 165/78; 165/185; 361/704
(58) Field of Classification Search ............... 165/78, 165/80.3, 185; 361/704
See application file for complete search history.

(56) References Cited

U.S. PATENT DOCUMENTS

| | | | | |
|---|---|---|---|---|
| 6,619,381 B1 * | 9/2003 | Lee | .............. | 165/78 |
| 6,644,386 B1 * | 11/2003 | Hsu | .............. | 165/80.3 |
| 7,032,650 B1 * | 4/2006 | Tian | .............. | 165/80.3 |
| 2004/0112569 A1 * | 6/2004 | You-Tien | ........ | 165/78 |
| 2004/0182543 A1 * | 9/2004 | Shao | .............. | 165/80.3 |
| 2005/0022972 A1 * | 2/2005 | Cheng-Tung et al. | ... | 165/80.3 |

\* cited by examiner

*Primary Examiner*—Leonard R Leo
(74) *Attorney, Agent, or Firm*—Rosenberg, Klein & Lee

(57) ABSTRACT

A heat dissipating device includes multiple self-aligning, interconnecting fins linked together. Each self-aligning, interconnecting fin has a first side edge, a second side edge, an inside surface, an outside surface, multiple alignment arms, and multiple outer connecting tabs. The alignment arms perpendicularly extend respectively from the first side edge and the second side edge and have distal ends and multiple inclined edges. The inclined edges press respectively against inclined edges of corresponding alignment arms on an adjacent fin. Then the outer connecting tabs are bent inward against the inside surface of the adjacent fin to hold the fins together securely.

2 Claims, 8 Drawing Sheets

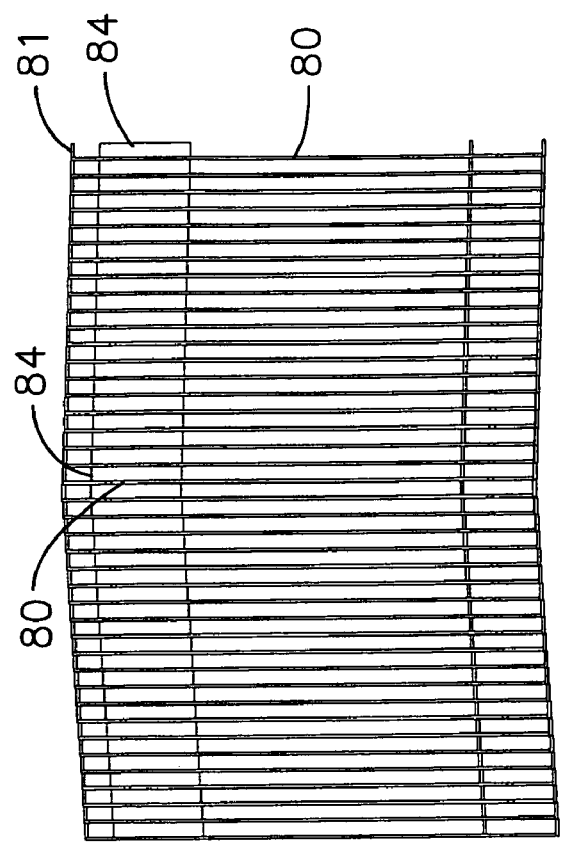
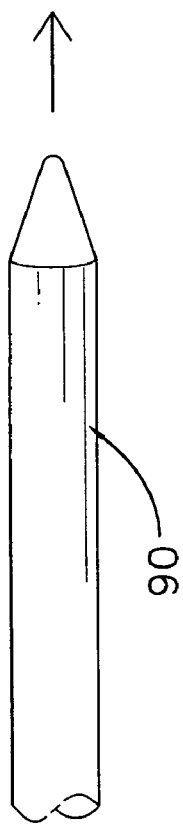
FIG. 8
PRIOR ART

HEAT DISSIPATING DEVICE

BACKGROUND OF THE INVENTION

1. Field of the Invention

The present invention relates to a heat dissipating device, and more particularly to a heat dissipating device composed of multiple separable heat dissipating fins.

2. Description of Related Art

A conventional heat dissipating device is composed of multiple separable heat dissipating fins assembled close together to increase the surface area to dissipate heat. Heat dissipating devices for CPUs (central processing units) require a large area to dissipate the heat generated by the increased CPU speed. To meet the dissipating needs and keep the surface temperature of CPUs within operating parameters, heat conduction features are also incorporated into conventional heat dissipating devices.

With reference to FIGS. 7 and 8, a conventional heat dissipation device has multiple heat dissipating fins (80) and multiple heat conduction pipes (90).

Each heat dissipating fin (80) has an upper edge (801), a lower edge (802), two notched holes (84), four connector holes (82), four connector tabs (83) and multiple folded tabs (81). The two notched holes (84) are formed near the upper edge (801). Two of the connector holes (82) are formed near the upper edge (801), and the other two of the connector holes (82) are formed near the lower edge (802) The four connector tabs (83) extend respectively from the four connector holes (82) and are mounted respectively in the four connector holes (82) in an adjacent heat dissipating fin (80) to connect adjacent heat dissipating fins (80) together. The folded tabs (81) are formed respectively on the upper edge (801) and the lower edge (802).

The heat conduction pipes (90) are mounted respectively through the notched holes (84) to increase the heat dissipating rate. However, the fins (80) are loosely connected so the distance between the fins will vary during manufacturing.

SUMMARY OF THE INVENTION

The main objective of the present invention is to provide a heat dissipating device that is manufactured with in a constant distance between all fins.

To achieve the objective, the heat dissipating device in accordance with the present invention includes multiple self-aligning, interconnecting fins linked together. Each self-aligning, interconnecting fin has a first side edge, a second side edge, an inside surface, an outside surface, multiple alignment arms, multiple outer connecting tabs, multiple optional inner connecting tabs and multiple optional sidewalls. The alignment arms have distal ends and inclined edges and perpendicularly extends respectively from the first side edge and the second side edge. The outer connecting tabs and the inner connecting tabs are staggered. The sidewalls are formed respectively on the first and second side edges. The inclined edges of the alignment arms press respectively against the inclined edges of corresponding alignment arms on the adjacent fin. Then the inner connecting tabs are bent inward against the outside surface of the adjacent fin. The outer connecting tabs are bent inward against the inside surface of the adjacent fin to hold the fins together securely.

Further benefits and advantages of the present invention will become apparent during a careful reading of the detailed description with appropriate reference to the accompanying drawings.

BRIEF DESCRIPTION OF THE DRAWINGS

FIG. 8 is a partially exploded side view of the conventional heat dissipation in FIG. 7.

DETAILED DESCRIPTION OF THE PREFERRED EMBODIMENT

Figure 1:
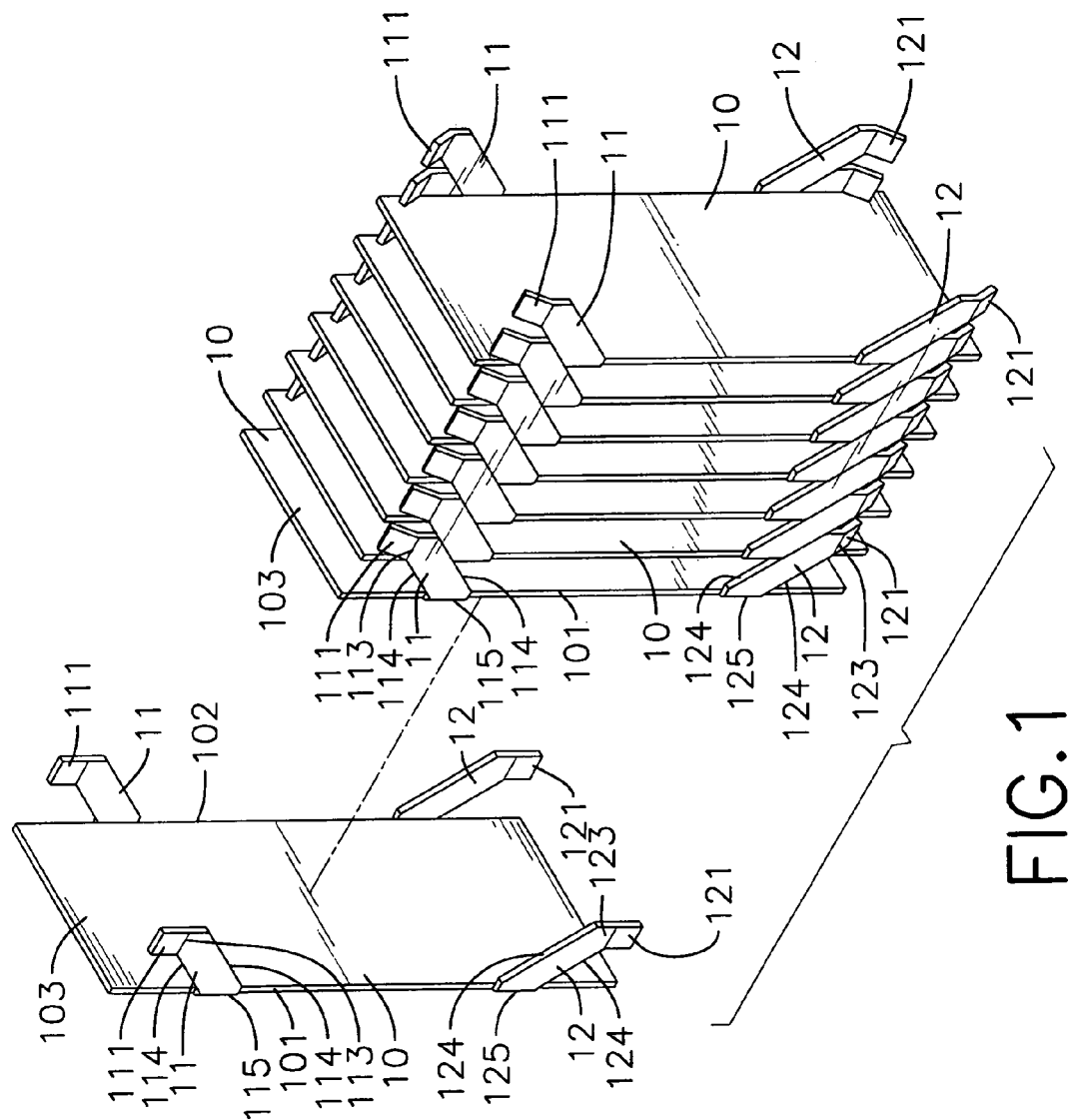
FIG. 1 is an exploded perspective view of a first embodiment of a heat dissipating device in accordance with the present invention.

With reference to FIG. 1, a first embodiment of a heat dissipating device in accordance with the present invention has multiple self-aligning, interconnecting fins (10). Each self-aligning, interconnecting fin (10) has a first side edge (101), a second side edge (102), an inside surface (103), two upper alignment arms (11), two lower alignment arms (12), two upper outer connecting tabs (111) and two lower outer connecting tabs (121). Each alignment arm (11,12) has a proximal end (115,125), a distal end (113,123) and multiple inclined edges (114,124). The proximal ends (115) of the two upper alignment arms (11) are formed respectively on the first side edge (101) and the second side edge (102), and the two upper alignment arms (11) perpendicularly extend respectively from the first side edge (101) and the second side edge (102). The two lower alignment arms (12) perpendicularly extend respectively from the first side edge (101) and the second side edge (102) at the proximal ends (125) of the alignment arms (12). The outer connecting tabs (111,121) are formed on the distal ends (113,123) of the alignment arms (11, 12).

Figure 2:
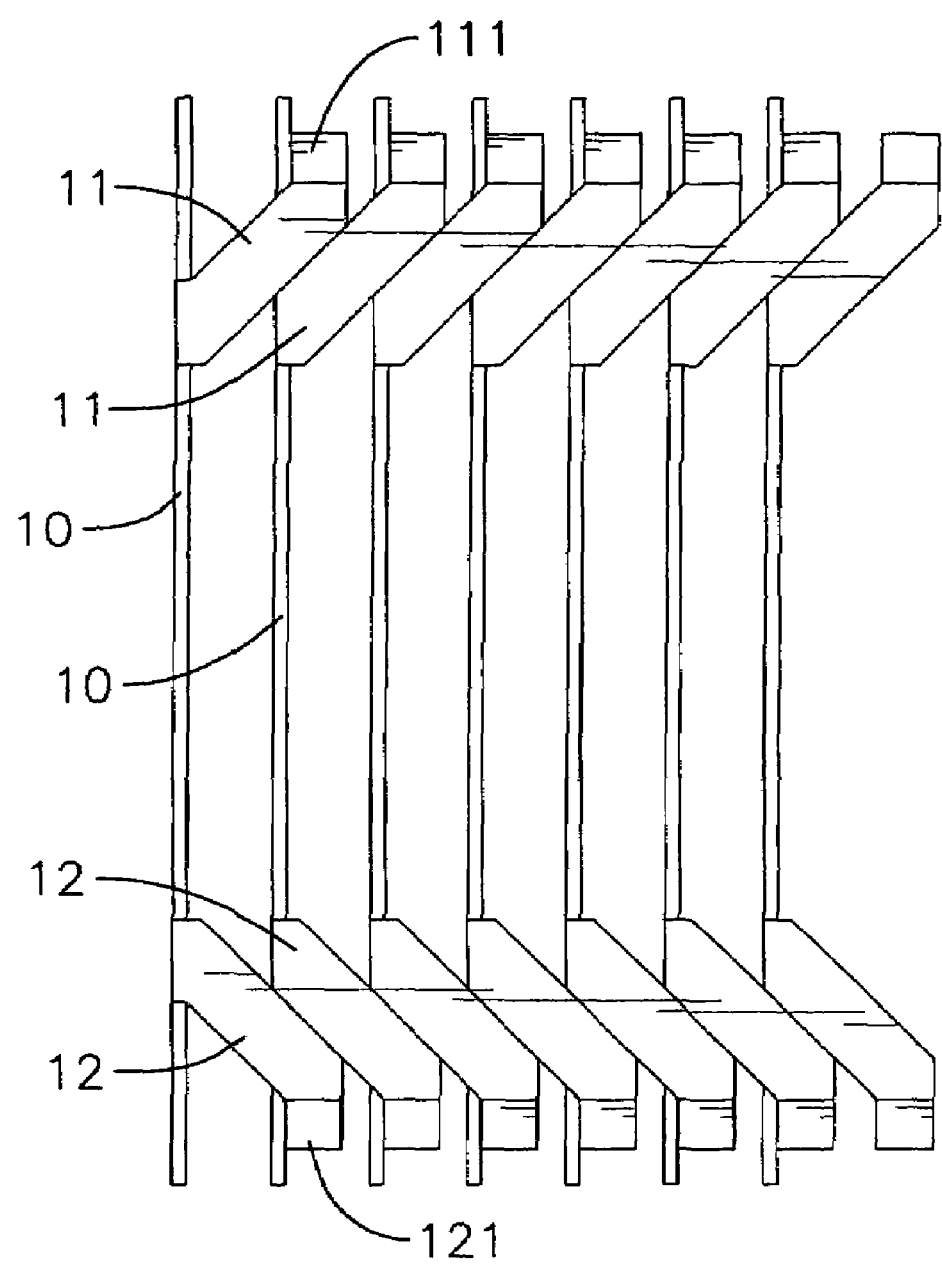
FIG. 2 is a side view of the heat dissipating device in FIG. 1.
Figure 3:
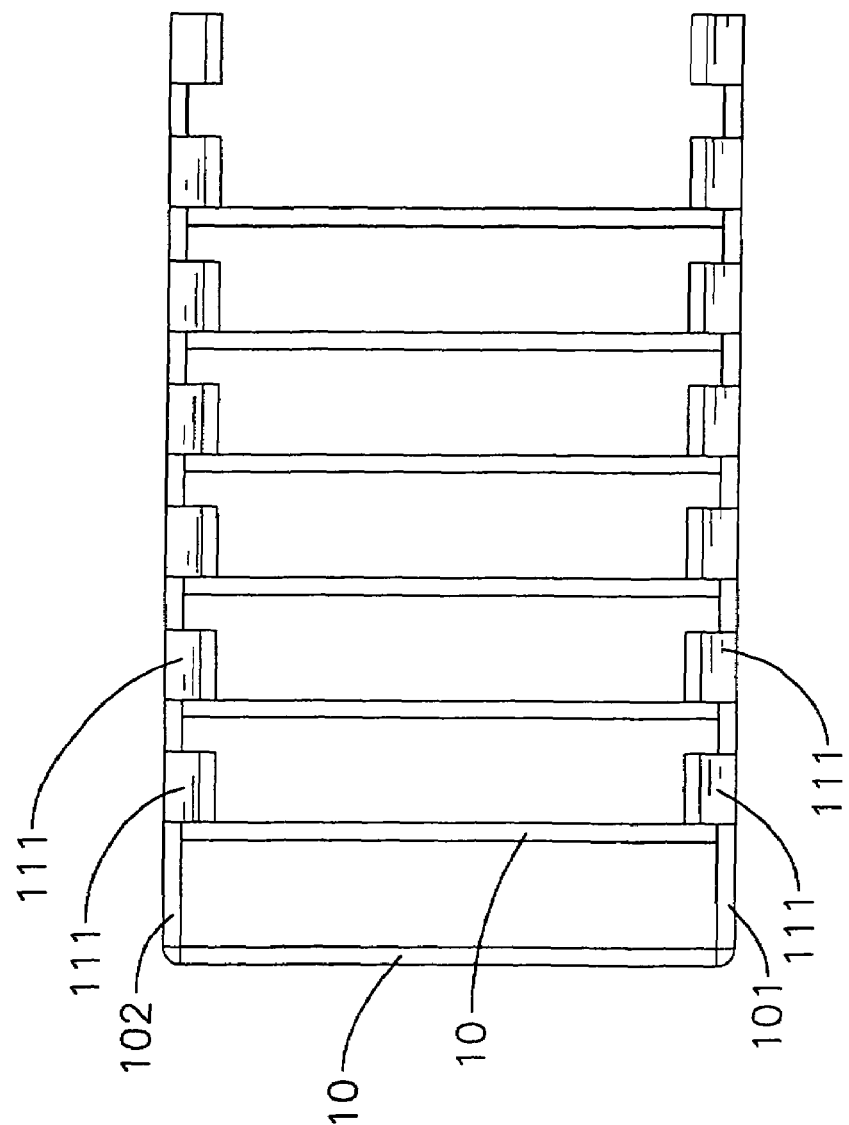
FIG. 3 is a top view of the heat dissipating device in FIG. 1.

With further reference to FIGS. 2 and 3, adjacent fins (10) are connected by pressing the inclined edges (114,124) of the alignment arms (11,12) on one fin (10) respectively against the inclined edges (114,124) of corresponding alignment arms (11) on an adjacent fin (10). With the inclined edges (114, 124) pressed together, the two upper outer connecting tabs (111) and the two lower outer connecting tabs (121) are bent inward against the inside surface (103) of the adjacent fin (10) to hold the fins (10) together securely.

Figure 4:
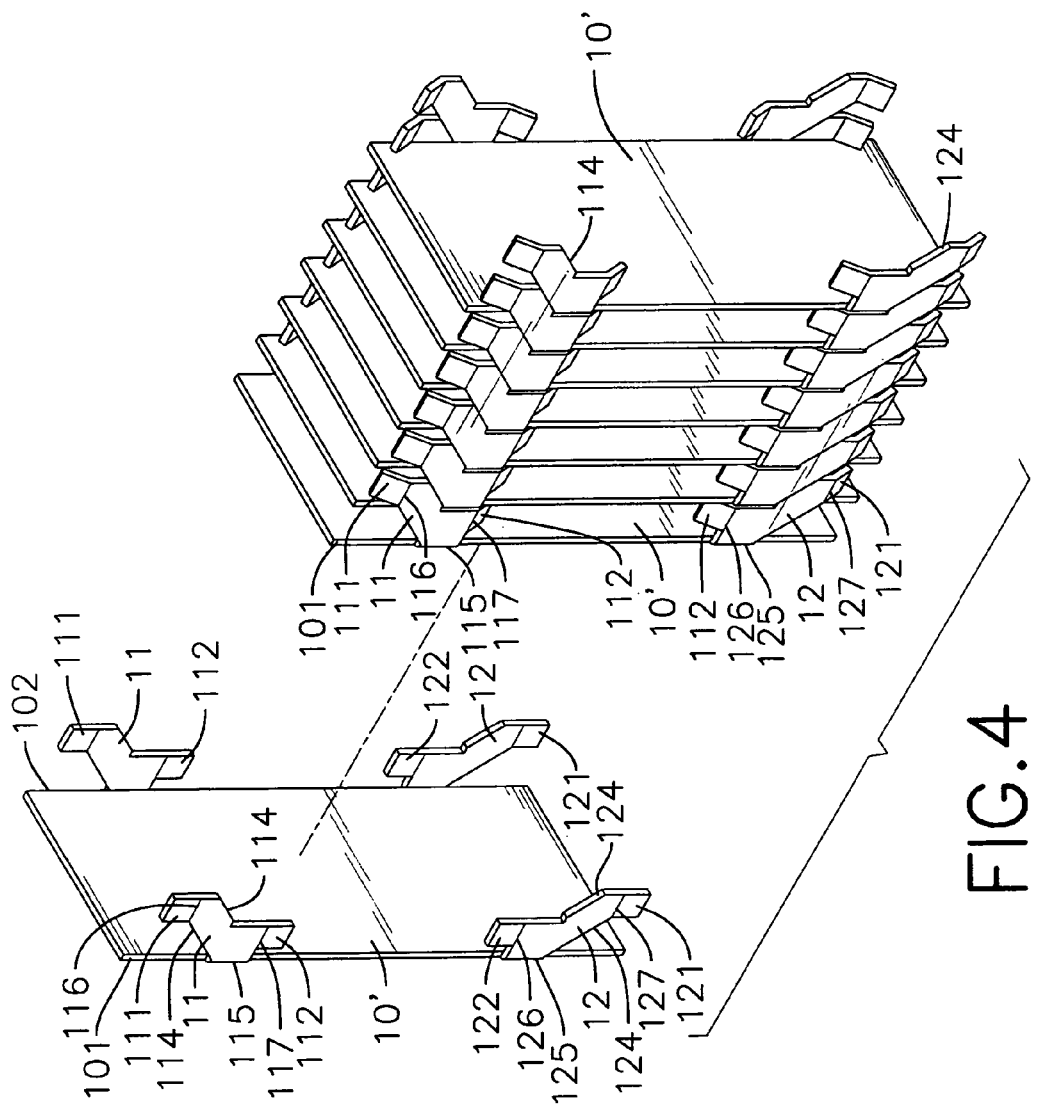
FIG. 4 is an exploded perspective view of a second embodiment of a heat dissipating device in accordance with the present invention.

With reference FIG. 4, a second embodiment of a self-aligning, interconnecting fin (10') in accordance with the present invention has a first side edge (101), a second side edge (102), two upper alignment arms (11), two lower alignment arms (12), an inside surface (103), an outside surface, two upper outer connecting tabs (111), two lower outer connecting tabs (121), two upper inner connecting tabs (112) and two lower inner connecting tabs (122). Each alignment arm (11,12) has a top (116,126), a bottom (117, 127) and multiple inclined edges (114,124). The upper outer connecting tabs (111) are formed on and extend respectively from the tops (116) of the upper alignment arms (11). The upper inner connecting tabs (112) are formed on and extend respectively from the bottoms (117, 127) of the two upper outer connecting tabs (111) so that the two upper outer connecting tabs (111) and the two upper inner connecting tabs (112) are staggered. The two lower inner connecting tabs (122) are formed on and extend respectively from the tops (126) of the two lower alignment arms (12). The two lower outer connecting tabs (121) are formed on and extend respectively from the bottoms (127) so the two lower outer connecting tabs (121) and the two lower inner connecting tabs (122) are staggered.

Adjacent fins (10') are connected by pressing the inclined edges (114,124) of the alignment arms (11,12) respectively against the inclined edges (114,124) of corresponding alignment arms (11) on an adjacent fin (10'). With the inclined edges (114, 124) pressed together, the two inner connecting tabs (112, 122) are bent inward against the outside surface of the adjacent fin (10') and the outer connecting tabs (111, 121) are bent inward against the inside surface (103) of the adjacent fin (10') to hold the fins (10') together securely.

Figure 5:
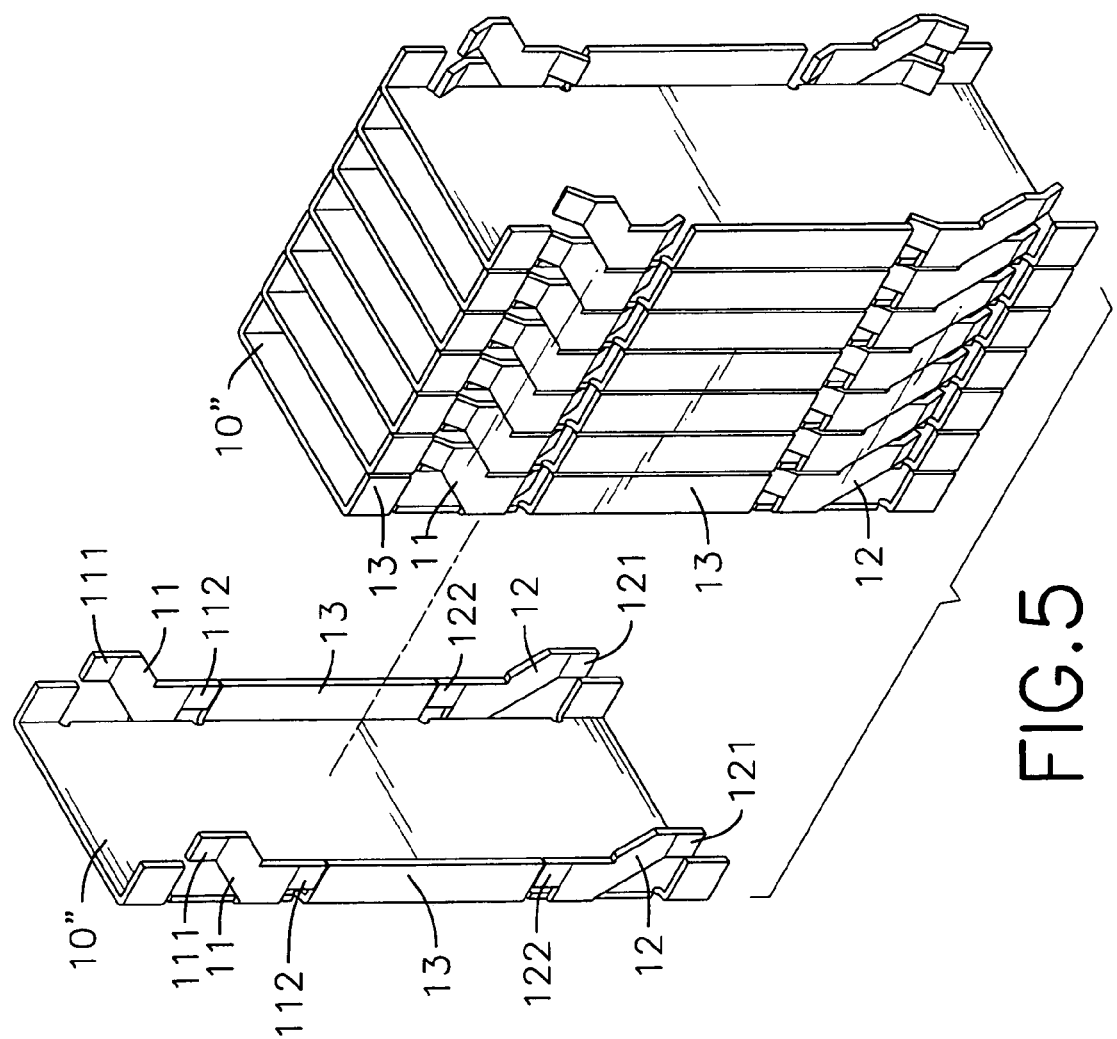
FIG. 5 is an exploded perspective view of a third embodiment of a heat dissipating device in accordance with the present invention.
Figure 6:
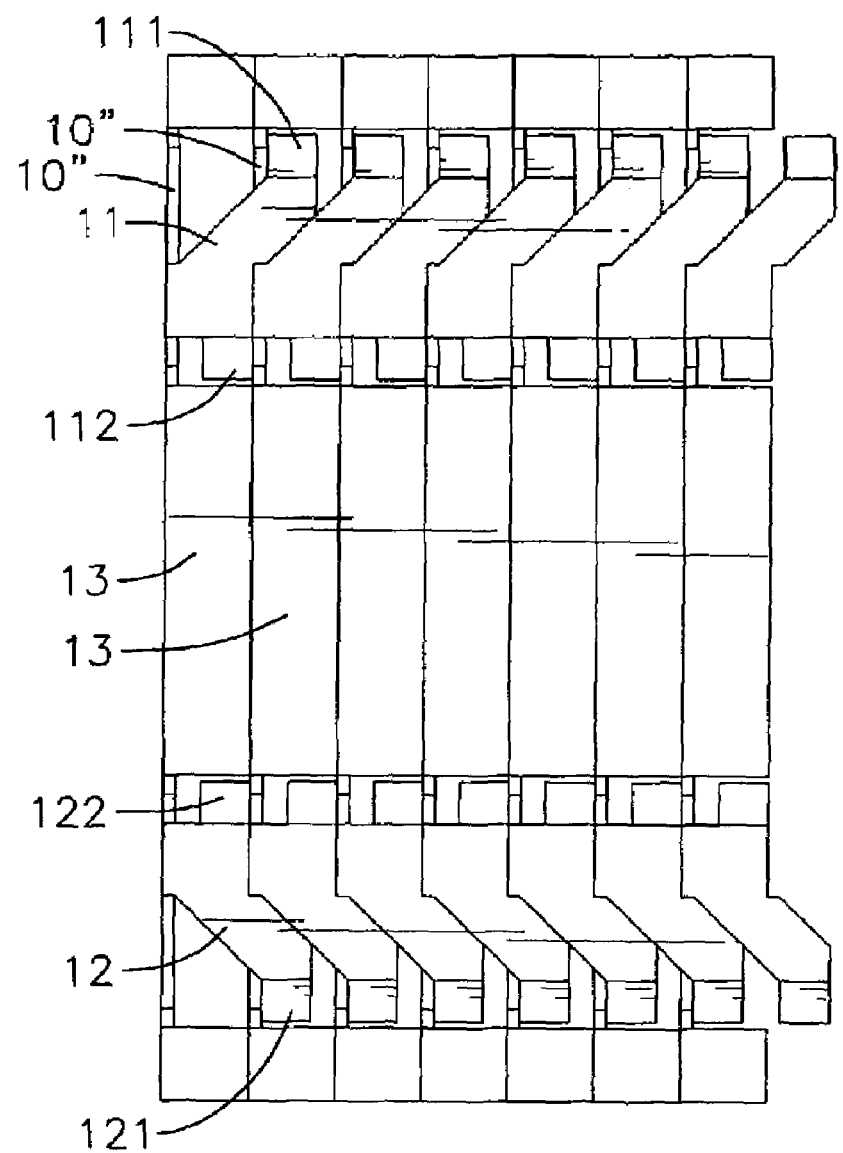
FIG. 6 is a side view of the heat dissipating device in FIG. 5.
Figure 7:
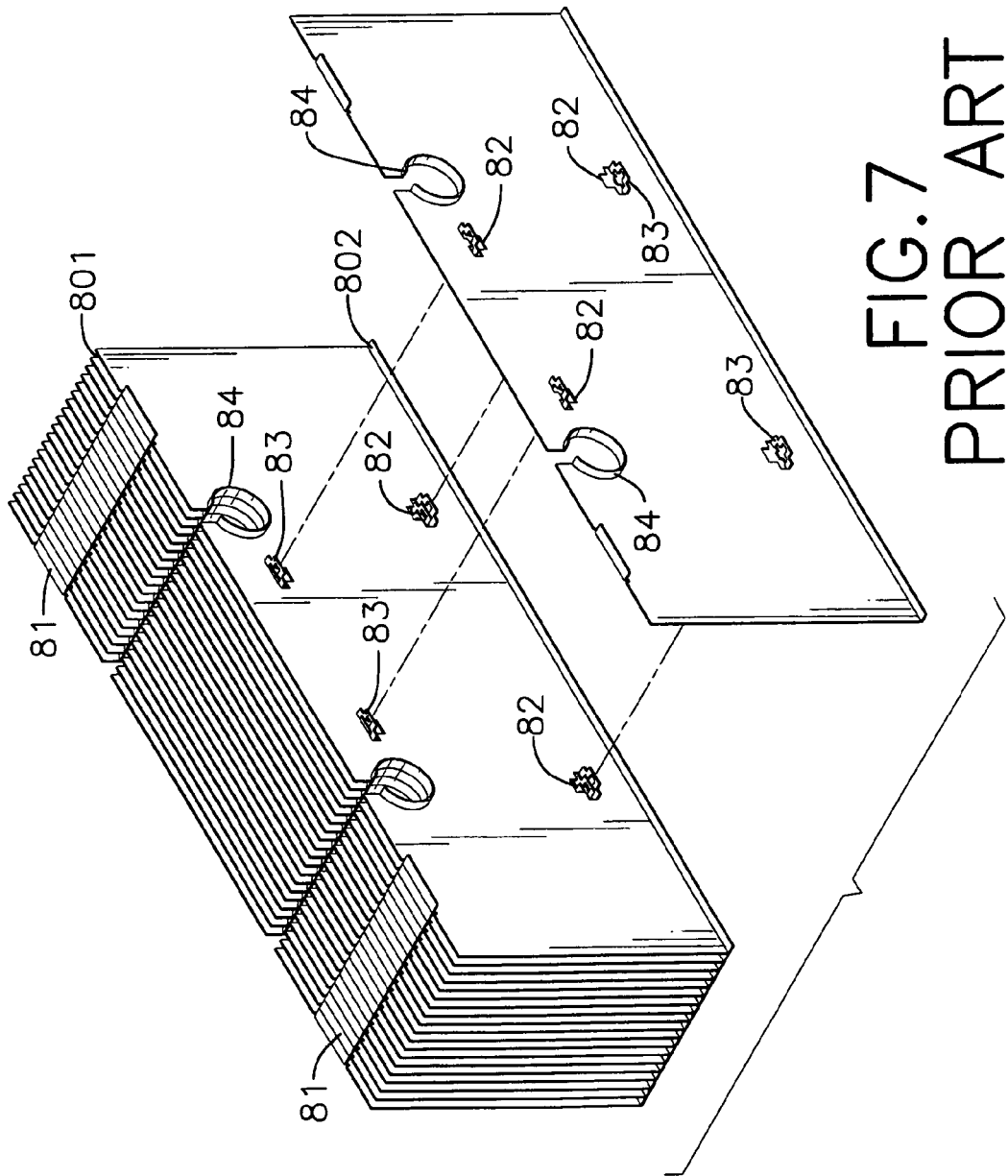
FIG. 7 is an exploded perspective view of a conventional heat dissipation device in accordance with the prior art without heat conduction pipes.

With reference FIGS. 5 and 6, a third embodiment of a self-aligning, interconnecting fin (10") further has two sidewalls (13). The sidewalls (13) are formed respectively on the first side edge (101) and second side edge (102), and each sidewall (13) has at least one continuous segment. The sidewalls (13) direct or restrict airflow. Adjacent fins (10") are connected exactly the same as the second embodiment.

Consequently, adjacent fins (10, 10', 10") in accordance with the present invention are connected with a constant separation during the manufacturing process.

Although the invention has been explained in relation to its preferred embodiment, many other possible modifications and variations can be made without departing from the spirit and scope of the invention as hereinafter claimed.

What is claimed is:

1. A heat dissipating device comprising:
multiple self-aligning, interconnecting fins, each self-aligning, interconnecting fin including:
 a first side edge;
 a second side edge;
 an inside surface;
 an outside surface;
 multiple upper alignment arms perpendicularly extending respectively from the first side edge and the second side edge and each alignment arm having:
  a proximal end formed on a corresponding side edge;
  a distal end;
  two inclined edges; and
 multiple lower alignment arms perpendicularly extending respectively from the first side edge and the second side edge, and each lower alignment arm having
  a proximal end formed on a corresponding side edge;
  a distal end; and
  two inclined edges;
 multiple upper outer connecting tabs formed upward on the distal ends of the upper alignment arms;
 multiple lower outer connecting tabs formed downward on the distal ends of the lower alignment arms; and
multiple inner connecting tabs staggered from the upper outer connecting tabs and the lower outer connecting tabs.

2. The heat dissipating device as claimed in claim 1, wherein each self-aligning, interconnecting fin has two sidewalls formed respectively on the first and second side edges and each side wall having at least one continuous segment.

* * * * *